Jan. 5, 1971 J. LEBRUN 3,553,030

RADIATION-SENSITIVE SEMICODUCTOR DEVICE

Filed Nov. 12, 1968 2 Sheets-Sheet 1

INVENTOR.
JEAN LEBRUN

BY
Frank R. Trifari
AGENT

Jan. 5, 1971 J. LEBRUN 3,553,030

RADIATION-SENSITIVE SEMICODUCTOR DEVICE

Filed Nov. 12, 1968 2 Sheets-Sheet 2

INVENTOR.
JEAN LEBRUN
BY
Frank R. Trifari
AGENT

1

3,553,030
RADIATION-SENSITIVE SEMICONDUCTOR DEVICE

Jean Lebrun, Paris, France, assignor, by mesne assignments, to U.S. Philips Corporation, New York, N.Y., a corporation of Delaware Filed Nov. 12, 1968, Ser. No. 774,852
Claims priority, application France, Nov. 15, 1967, 128,265
Int. Cl. H01e 15/00
U.S. Cl. 136—89 10 Claims

ABSTRACT OF THE DISCLOSURE

A flexible panel provided with solar batteries characterized in that it comprises a flexible insulating support having on at least one of its faces metallic zones at least some of which are cut across the thickness of the support to form tags for the electric interconnection of said radiation-sensitive elements and at least partially for fixing said elements to said support.

The invention relates to a device for converting radiation into electric energy comprising a battery of radiation-sensitive semiconductor elements electrically interconnected and arranged on a flexible support.

The invention furthermore relates to a support for such a semiconductor device and to a method of manufacturing such a semiconductor device.

Radiation-sensitive devices of the kind set forth are known and may be employed for detecting radiation energy or for producing electric power by the conversion of radiation energy. The radiation may be electro-magnetic or corpuscular radiation.

The invention is particularly important for space explorations. It is known that the electric energy required for the operation of the various instruments in satellites and other space vehicles is furnished for a large part by solar batteries. These batteries have the form of flat or curved panels on which several hundred elementary solar cells are provided near each other in a regular mosaic, the cells being electrically connected in series and/or in parallel combination in order to obtain the desired voltages and current densities.

For this use of solar batteries in space vehicles it is particularly important to have available panels of high mechanical flexibility, so that they can be applied to the fuselage of said vehicles so as to match the external profile, while they occupy a small volume and a small surface during the periods of nonemployment of the batteries, for example, during the launching of a satellite and before it is put into orbit, the panels unfolding to a large surface at the desired instant.

The research of high flexibility of the panel is also related to the necessity for each solar battery to have a given mechanical independence with respect to the neighbouring batteries so that it can be avoided that regions of mechanical stress are formed in the panel due to the thermal shocks produced by the consecutive transitions of the panel from a solar zone to a dark zone and conversely and due to the vibrations produced during launching, which mechanical stresses are capable of causing breakage or at least serious damage.

The known technology by which with solar batteries of rigid structure panels of sufficient flexibility can be obtained for matching curved profiles or small radii consists in establishing the interconnections between the batteries by means of ribbons or thin metal strips suitably

2 annealed, fixed by soldering to the rear face of one battery and to one of the edges of the front face of the neighbouring battery. Owing to their natural flexibility of the ribbons or strips and if the support is made of a flexible material, the panels can be deformed to a limited extent.

This technique is employed in the method of interconnecting solar batteries described in French patent specification No. 1,423,414. In order to obtain a maximum flexibility of the panel compatible with a satisfactory mechanical resistance of the soldering joints the interconnecting element described in said patent specification is formed by a perforated metal strip forming a grating of a thickness of about 0.05 mm. The solar batteries interconnected by said grating are subsequently stuck to a support formed by an insulated metal sheet by means of a silicon rubber adhesive or directly to a substrate of said adhesive. The resultant panels permit of being wound independently.

The manufacture of such assemblies requires much skill and much time. It is first necessary to interconnect the various batteries by means of ribbons or metal gratings. Then the resultant matrix has to be stuck to an external support. The metal connecting strip, especially the grating, is very vulnerable. The matrix of batteries has to be manipulated very carefully as long as it is not fixed to an external support. Consequently the manufacture of panels of solar batteries is particularly difficult by the nature of the work and by the fragility of the component parts.

The present invention obviates these difficulties. It permits of obtaining assemblies in which each solar battery has an increased mechanical independence with respect to the neighbouring batteries so that the assembly has a greater resistance against the thermal shocks and vibrations. The invention furthermore permits of reducing the weight of the assemblies by minimizing the sectional areas of the electric connections between the batteries, whilst each connection has a larger contact surface.

A device of the kind set forth according to the invention is characterized in that the support is formed by a flexible sheet of electrically insulating material having on at least one side metallised surface portions provided with incisions across the thickness of the sheet so that tags are formed whose metallized surface is in contact with a radiation-sensitive element, the electric interconnection of the radiation-sensitive elements and their mechanical fixation to the support being obtained at least in part by the tags and the metallized surface portions.

The flexible support forming the substrate of the panel is made of an insulating flexible material having physical, chemical and mechanical properties likely to remain practically constant in a temperature interval of —70° C. and +70° C. Particularly suitable have proved to be polyimide resins of the kind described in U.S. patent specification No. 3,179,634. It is preferred to use a polyimide resin known under the trademark of "Kapton" marketed by Du Pont de Nemours. This material will remain flexible and resistant and will maintain substantially its further properties between about —200° C. and +300° C.

In a first preferred embodiment the radiation-sensitive elements comprise a semiconductor wafer provided on either side with an electrode layer.

A further important preferred embodiment is characterized in that the support comprises on one side metallized surface portions and at least two opposite tags associated with adjacent metallized surface portions, one of the tags being folded so that its insulating surface is opposite the insulating face of the support, whereas its metallized surface is in contact with one of the electrode layers of a radiation-sensitive element, the other tag being in contact with the other electrode layer of the radiation-sensitive element by its metallized surface.

In a further preferred embodiment of the invention the device is characterized in that the support comprises on one side a first group of metallized surface portions in which tags are formed by incisions, while opposite each of these surface portions on the other side of the support a smaller metallized surface portion associated with a second group is provided, which portion is galvanically connected with the opposite metallized surface portion of the first group, for example, by means of a metallized hole, while by one of its electrode layers each radiation-sensitive element is in contact with a tag of the first group and by the other electrode layer with a metallized surface portion of the second group, which portion is not galvanically connected with said tag.

In order to obtain a supporting panel for radiation-sensitive elements according to the invention the support may be covered with a film of a few microns in thickness of a metal such as copper or silver on one or on both sides in accordance with the desired particular characteristics of the connecting network. This may be carried out by known methods of vapour deposition in vacuo on the whole support, the portions to be eliminated being subsequently etched away or by means of a selective mask. It should be noted that the preparation of a solar panel may be facilitated by using the commercially available plastics supports provided with metal coatings. The aforesaid "Kapton" for example is obtainable in the form of sheets coated on one or on both faces with a copper layer. It is also possible to form the connecting network by means of zones and laminations cut from thin metal sheets (thickness about $15\mu$) provided on one face with a resin polymerizing in the cold state for holding the elements on the plastics support. Such auto-adhesive sheets are commercially available.

In a second stage of the manufacture of the solar panel according to the invention the support is cut across along a series of lines defining at the periphery or inside of the metal surface portions previously formed the connecting tags, which can be folded back to the support.

The electric connection between the electrodes of the elements and the metal surface portions in established according to the invention by means of a suitable eutectic, for example, an alloy of lead, tin and antimony, which is caused to melt by heating the support at a temperature of about 90° C., whilst the radiation-sensitive elements are heated for a few seconds at about 200° C. at least at their side remote from the support.

In order to connect the batteries in parallel it is sufficient to provide between the metal zones in which the connecting tags are cut metal laminations of different widths in accordance with the value of the current to be passed through the elements concerned.

An important advantage of the method according to the invention for the manufacture of a panel of solar batteries resides in the semimechanization of the manufacture, which has hitherto been a manual process. The part of the process concerning the preparation of the support, i.e., metallisation and cutting of the connecting tags can be rapidly carried out by industrial methods. Handwork is thus restricted to the disposition of the batteries on the support and to the suitable disposition of the tags. This operation is, however, much easier than that of making first a matrix by means of ribbons or metal strips and of sticking subsequently the matrix to a support.

Since the connecting network is initially integral with the support, it need not have a natural mechanical resistance as in the case of the ribbons or gratings. It is therefore possible to design said network simply on the basis of its electrical function. This results in a saving of weight, which though not important, is appreciable for cases in which minimum weight is imperative.

A further advantage resides in that the batteries are mechanically interconnected only by the plastics support, since from the mechanical point of view the connections provided by printed wiring are negligible. Thus the influence of thermal shocks and vibrations on the longevity of the panel is minimized especially when the mechanical properties of the support are little affected by the great temperature fluctuations.

The connections between the elements do not introduce mechanical resistance and the panel obtained can be easily folded. It is sufficient to provide a distribution of the elements such that folding zones of sufficient width are left so that no tensile force is exerted on the connecting tags, which might otherwise be torn from the elements. By providing a suitable free zone between the elements the panel can be easily coiled.

Finally the replacement of an element having been damaged during the mounting operation can be readily carried out on a panel according to the invention. Since each element is mechanically independent of its neighbours, it is sufficient to dislodge the defective element from the connecting tags concerned and to resolder directly another element.

The invention furthermore relates to a support suitable for use in a device according to the invention. Instead of solar batteries for example radiation detectors in the form of photo-resistors or other radiation-sensitive elements may be arranged on such a support.

The invention will now be described more fully with reference to the accompanying drawing, which shows a panel intended to receive six radiation-sensitive elements for simplification of the picture, which elements are interconnected in two series of three elements arranged in parallel; it will be obvious that the number of elements may be considerably greater and that they may be mounted differently.

Figures 1, 2, 3, 4, 5, 6, 7:
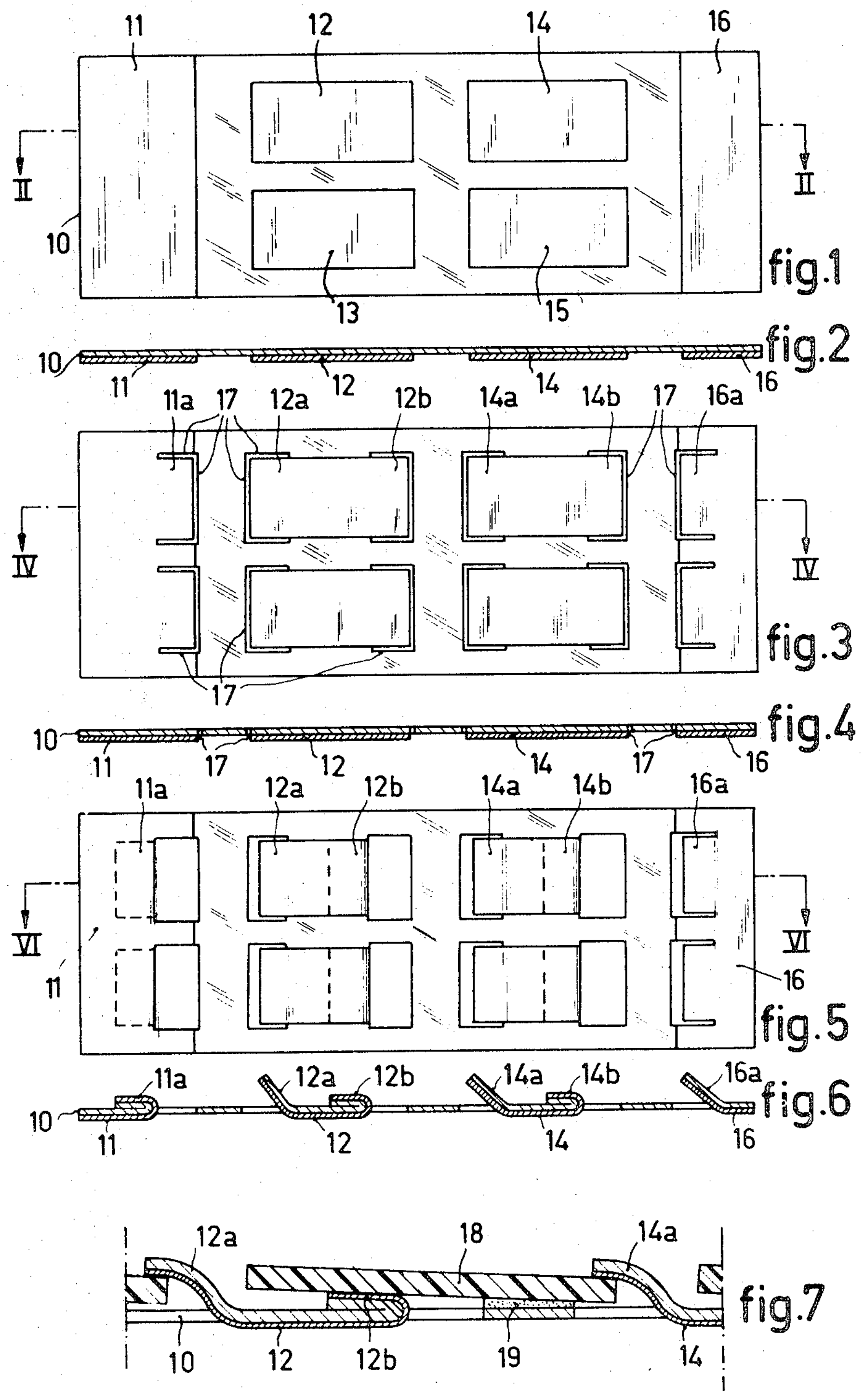
FIG. 1 is a plan view of a flexible support coated with metal zones for the interconnection of the radiation-sensitive elements.
FIG. 2 is a sectional view taken on the line II—II in FIG. 1 of the support of FIG. 1.
FIG. 3 is a plan view of the support after the connecting tags are cut out.
FIG. 4 is a sectional view taken on the line IV—IV in FIG. 3.
FIGS. 5 and 6 are a plan view and a sectional view respectively taken on the line VI—VI of the panel according to the invention prior to the disposition of the elements.
FIG. 7 shows on an enlarged scale a partial elevation of the panel of FIGS. 5 and 6, in which a radiation-sensitive element is arranged.

The flexible support 10 of FIGS. 1 and 2 is made of an insulating plastics material provided on one face with several separate metallic zones 11, 12, 13, 14, 15 and 16, for example, of rectangular shape, the thickness of which may vary between one and several ten microns according to need. These zones may have one layer of one metal or several layers applied one onto the other. The upper layer, that is to say the layer farthest remote from the support, is preferably silver, deposited from the vapour phase in vacuo. In the embodiment shown in said figures the zones 12 to 15 form a pattern of lines and columns, whereas the zones 11 and 16 are located one on each side of said pattern so that their width is at least equal to that of the pattern.

The resultant support 10 is cut across along a series of lines 17 (the width of which is shown exaggerated in FIGS. 3 and 4), so that at the peripheries of said metal zones tags such as 11*a*, 12*a* and 12*b*, 14*a* and 14*b*, 16*a* can be disengaged, the positions being such that each of them is located opposite another connected with a further zone. These tags partly disengaged from the support 10 have a given freedom of movement relative to the support so that they may be employed as electric connecting elements for the radiation-sensitive elements with which the support has to be equipped. For this purpose the tags 11*a*, 12*b* and 14*b* are folded back so that their insulating face is in contact with the uncoated insulating face of the support 10; the tags 12*a*, 14*a* and 16*a* are only bent in a direction towards said uncoated face (see FIGS. 5 and 6). This also applies to the tags not designated in the figures cut in the zones 13 and 15 as indicated.

Between two opposite tags associated with different metal zones, for example, the tags 12*b* and 14*a* (see FIGS. 6 and 7) a radiation-sensitive element 18 is connected. The rear face of the element 18 coated in known manner with a conductive layer, for example, of silver, is brought into contact by part of its surface with the metallic part of the folded tag 12*b*, whereas the tag 14*a* is folded back to the collector electrode arranged at the edge of the front face of the element 18. Soldering laminations of an alloy of lead, tin and antimony are previously arranged on the contact areas to establish suitable mechanical and electric connections subsequent to melting of the alloy. A slight deposition 19 of an appropriate adhesive provides a sufficient mechanical rigidity of the assembly during the soldering operation. When all radiation-sensitive elements have been arranged on the panel, soldering is carried out by pre-heating the panel at about 90° C. by putting it, for example, on a heating surface and by means of a metal plate heated at a temperature of about 200° C. applied directly to the elements the alloy is caused to fuse. This operation takes 2 to 3 seconds per element or per group of elements.

In the embodiment shown in the preceding figures six elements can be disposed in the various areas provided on the support 10 and they may be interconnected by means of the various metal zones, whilst the zones 11 and 16 form the input and output electrodes respectively of the device. The latter zones comprise tags opposite the zones 12, 13 and 14, 15 respectively. In this way two series of three elements are obtained, connected in parallel by their ends. If it is desired to obtain parallel combinations at levels lying between said ends, it is sufficient for example to connect the zones 12 and 13 on the one hand, 14, 15 on the other by metal laminations which then have to be provided when the electric connecting network is traced.

For the sake of simplicity the metal zones 11, 12, 13, 14, 15 and 16 are shown in regular geometrical forms. Obviously a more accurate design of said zones may provide for the zone portions not coating the connecting tags a smaller surface in accordance with the low currents passing through them.

Figure 8:
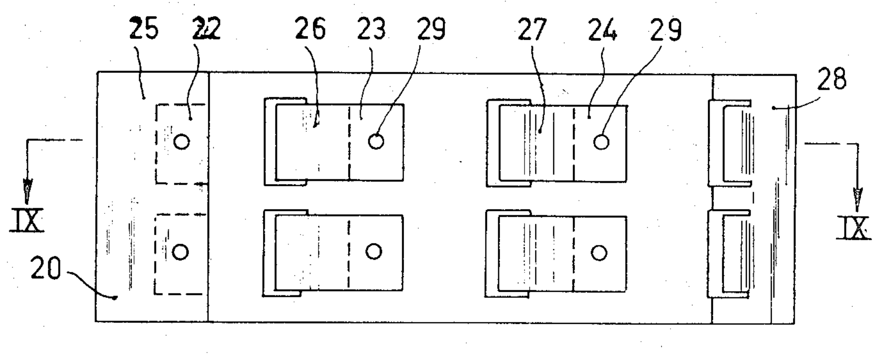
FIGS. 8, 9 and 10 illustrate in a variant of the invention the use of tongues cut from the body of the support and metallized holes as connecting members.
Figure 9:
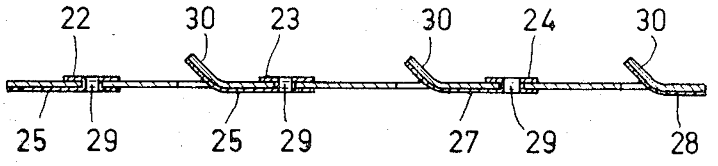
Figure 10:
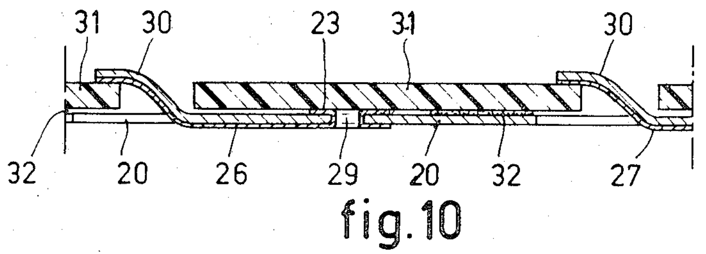

The flexible support 20 shown in FIGS. 8 to 10, intended for receiving also six radiation-sensitive elements, comprises metal zones deposited on each of its faces. These metal zones are shown in detail in FIG. 9, which is a sectional view taken on the line IX—IX in FIG. 8. From left to right in the figure the upper face of the support 20 shows in order of succession the zones 22, 23, 24 and the lower face of said support shows the zones 25, 26, 27 and 28 corresponding with the former zones, but having a larger surface. The assembly of these zones serves for the interconnection of a first series of three elements. Equivalent deposits not designated are provided parallel to the former for the connection of a second series of three elements.

The zones 25 and 28 of the end connections are single zones and are connected to the two series as stated above for the zones 11 and 16. The zones 22 and 25, 23 and 26, 24 and 27 are pairwise interconnected by metallized holes 29 provided by a known technique in printed wiring. The support 20 provided with the various zones interconnected by the metallized holes 29 is cut opposite the zones 25, 26 and 27 to form a connecting tag 30 at the periphery of each zone 26, 27 and 28.

Radiation-sensitive elements 31 are then deposited on the support 20 and interconnected in the manner shown on an enlarged scale in FIG. 10. The rear face of an element 31 is brought into contact for example with the metal zone 23 via a soldering film (not shown) whereas one of the tags 30, that is to say the tag cut from the metal zone 27, is brought into contact with the collector of the element arranged at one of the edges of the front face of the element. An adhesive 32 permits of fixing mechanically the element 31 prior to the soldering operation which is carried out in the same manner as described with the embodiment of a panel as referred to above. Also the tag 30 cut from the zone 26 is in contact with the element 31 in connection with the zone 22.

This method of interconnecting by means of metallized holes, which requires a further preparation of the supports, permits of avoiding folding back the tags, which operation may give rise to some difficulty in the case of a fairly thick support.

Obviously by employing other equivalent technical component parts several variants may be designed within the scope of the present invention.

What is claimed is:

1. A device for converting radiation into electric energy comprising a battery of radiation-sensitive semiconductor elements electrically interconnected and arranged on a flexible support characterized in that the support is formed by a flexible sheet of electrically insulating material having on at least one side metallized surface portions provided with incisions across the thickness of the sheet so that tags are formed whose metallized face is in contact with a radiation-sensitive element, the electric interconnection of the radiation-sensitive elements and their mechanical fixation to the support being obtained at least in part by the tags and the metallized surface portions.

2. A device as claimed in claim 1 characterized in that the radiation-sensitive elements comprise a semiconductor plate provided on both sides with an electrode layer.

3. A device as claimed in claim 2 characterized in that the support comprises on only one side metallized surface portions and at least two opposite tags associated with adjacent metallized surface portions, one of the tags being folded so that its insulating face is located opposite the insulating face of the support and the metallized face of the tag is in contact with one of the electrode layers of a radiation-sensitive element, whereas the other tag is in contact by its metallized face with the other electrode layer of said element.

4. A device as claimed in claim 2 characterized in that the support is provided on one side with a first group of metallized surface portions while opposite each of the surface portions on the other side of the support a smaller metallized surface portion is associated with a second group, which portion is galvanically connected with the opposite metallized surface portion of the first group, each radiation-sensitive element being in contact by one of its electrode layers with a tag associated with the first group and by the other electrode layer with a metallized surface portion of the second group not galvanically connected with said tag.

5. A device as claimed in claim 1 characterized in that the flexible support consists of a polyimide resin.

6. A device as claimed in claim 1 characterized in that the metallized surface portions are provided with a metal layer consisting of silver at least at its surface remote from the support.

7. A device as claimed in claim 1 characterized in that the radiation-sensitive elements are arranged in rows and are interconnected in series in one row.

8. A device as claimed in claim 1 characterized in that the radiation-sensitive elements are arranged in two or more rows and are connected in parallel with each other.

9. A device as claimed in claim 1 characterized in that the support is provided with metallized portions and in which the radiation-sensitive elements includes electrode layers which are secured to the metallized surface portions.

10. A device as claimed in claim 9 characterized in that the radiation-sensitive elements are additionally secured by an adhesive.

References Cited

UNITED STATES PATENTS

| | | | |
|---|---|---|---|
| 3,116,171 | 12/1963 | Nielsen et al. | 136—89 |
| 3,376,164 | 4/1968 | Bachwansky | 136—89 |
| 3,446,676 | 5/1969 | Webb | 136—89 |

ALLEN B. CURTIS, Primary Examiner